US009263456B2

(12) United States Patent
Saino

(10) Patent No.: US 9,263,456 B2
(45) Date of Patent: Feb. 16, 2016

(54) SEMICONDUCTOR DEVICE AND METHOD FOR MANUFACTURING THE SAME

(75) Inventor: Kanta Saino, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/533,598

(22) Filed: Jun. 26, 2012

(65) Prior Publication Data

US 2013/0020622 A1     Jan. 24, 2013

(30) Foreign Application Priority Data

Jul. 22, 2011   (JP) .................................. 2011-160791

(51) Int. Cl.
*H01L 27/108*     (2006.01)
*H01L 27/105*     (2006.01)

(52) U.S. Cl.
CPC .... *H01L 27/10894* (2013.01); *H01L 27/10873* (2013.01); *H01L 27/10885* (2013.01); *H01L 27/105* (2013.01); *H01L 27/10852* (2013.01)

(58) Field of Classification Search
CPC ................... H01L 27/10873; H01L 27/10885; H01L 27/10894; H01L 27/10852; H01L 27/105; H01L 27/10814
USPC .......... 257/296, 900; 438/238–239, 386, 399, 438/184, 230, 265, 303, 594
See application file for complete search history.

(56) References Cited

U.S. PATENT DOCUMENTS

| 2004/0076068 | A1* | 4/2004 | Yamada et al. ................. 365/232 |
| 2005/0040448 | A1* | 2/2005 | Park ................................. 257/296 |
| 2007/0080387 | A1* | 4/2007 | Liu et al. ......................... 257/303 |
| 2007/0114586 | A1* | 5/2007 | Graettinger et al. ........... 257/296 |
| 2009/0256214 | A1* | 10/2009 | Sun et al. ........................ 257/411 |
| 2009/0280615 | A1* | 11/2009 | Lee et al. ........................ 438/306 |
| 2011/0095348 | A1* | 4/2011 | Chakihara et al. ............. 257/298 |
| 2011/0124173 | A1* | 5/2011 | Kim et al. ....................... 438/305 |
| 2012/0205727 | A1* | 8/2012 | Kanakasabapathy et al. .............................. 257/288 |

FOREIGN PATENT DOCUMENTS

| JP | 2000-114372 | 4/2000 |
| JP | 2000-216373 | 8/2000 |
| JP | 2001-068546 | 3/2001 |
| JP | 2003-229567 | 8/2003 |
| JP | 2007012824 | 1/2007 |
| JP | 2009-194374 | 8/2009 |
| JP | 2011-129771 | 6/2011 |

* cited by examiner

*Primary Examiner* — Mohammed Shamsuzzaman

(57) ABSTRACT

A semiconductor device comprises a semiconductor substrate, a first transistor including a gate insulating film and a gate electrode sequentially formed on the semiconductor substrate, a sidewall, an interlayer insulating film formed on the semiconductor substrate, and a contact plug which penetrates through the interlayer insulating film and reaches the semiconductor substrate. The sidewall is formed on a side surface of the gate electrode, and includes a first insulating film and a second insulating film formed on the first insulating film and containing a metal oxide different from the first insulating film.

8 Claims, 18 Drawing Sheets

A

B

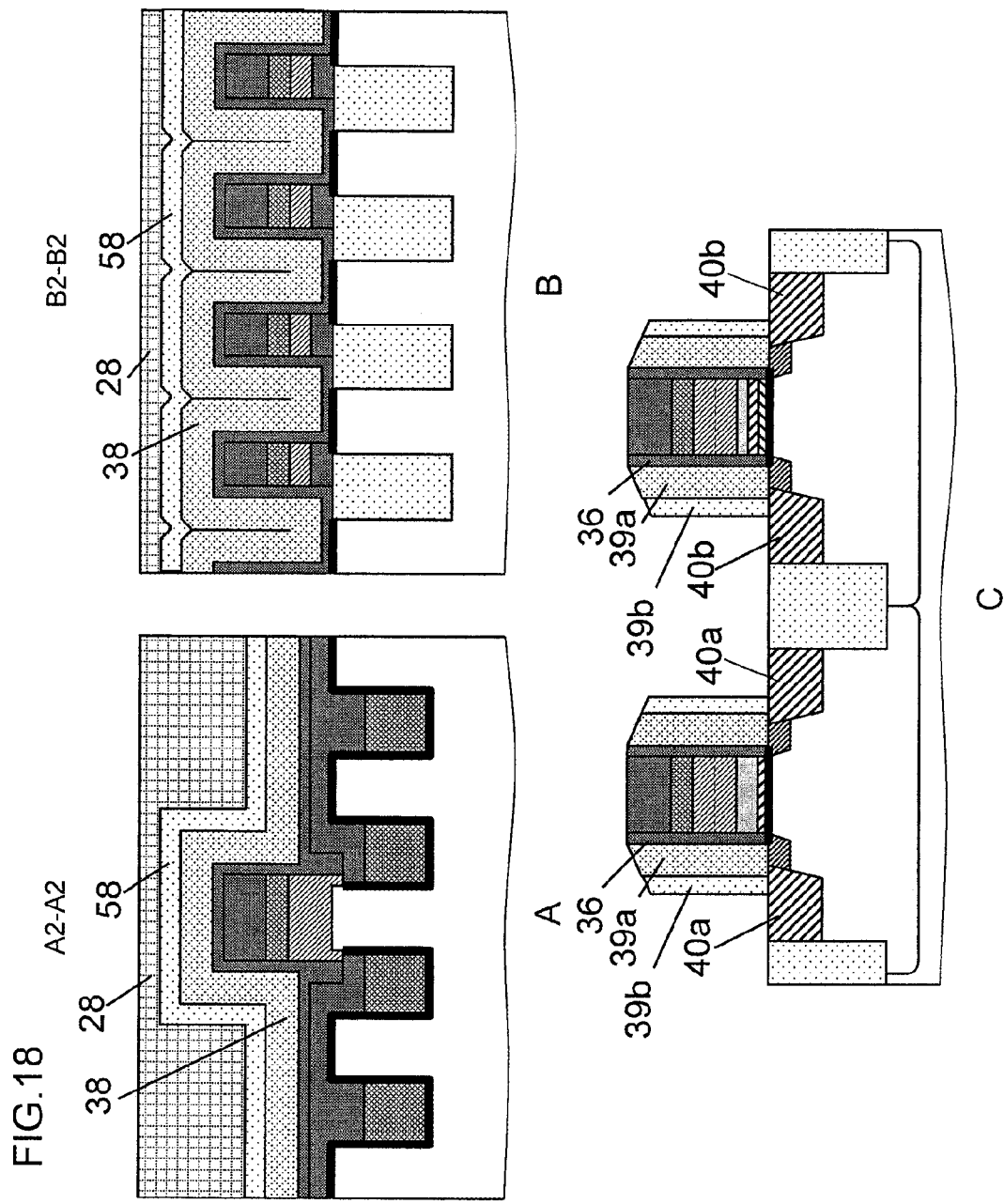

SEMICONDUCTOR DEVICE AND METHOD FOR MANUFACTURING THE SAME

This application is based upon and claims the benefit of priority from Japanese Patent Application No. 2011-160791 filed on Jul. 22, 2011, the disclosure of which are incorporated herein in its entirety by reference.

BACKGROUND OF THE INVENTION

1. Field of the Invention

The present invention relates to a semiconductor device and a method for manufacturing the same.

2. Description of the Related Art

In JP2000-216373 A1, there is described a method for forming a MOS transistor on a semiconductor substrate. In the document, a gate electrode is formed on the substrate with interposed a gate insulating film therebetween. An LDD region is then formed by forming a first sidewall on each side surface of the gate electrode and using the gate electrode and the first sidewalls as a mask to implant ions into the substrate. Using the first sidewalls suppresses thermal diffusion of impurities introduced by the ion implantation into the substrate under the gate electrode, thereby reducing gate-drain capacitance. Further, a source and a drain are formed by forming a second sidewall on the exterior side surface of each of the first sidewalls and using the gate electrode and the first and second sidewalls as a mask to implant ions into the substrate. In JP2000-216373 A1, each of the first and second sidewalls is formed of an insulating film made of silicon oxide or silicon nitride.

SUMMARY

In one embodiment, there is provided a semiconductor device, comprising:
- a semiconductor substrate;
- a first transistor including a gate insulating film and a gate electrode sequentially formed on the semiconductor substrate;
- a sidewall formed on a side surface of the gate electrode, the sidewall including a first insulating film and a second insulating film formed on the first insulating film and containing a metal oxide different from the first insulating film;
- an interlayer insulating film formed on the semiconductor substrate; and
- a contact plug which penetrates through the interlayer insulating film and reaches the semiconductor substrate.

In another embodiment, there is provided a method for manufacturing a semiconductor device, comprising:
- forming a gate insulating film and a gate electrode sequentially on a semiconductor substrate;
- forming a first insulating film on a side surface of the gate electrode;
- forming a second insulating film containing a metal oxide different from the first insulating film on the first insulating film;
- forming an interlayer insulating film on the semiconductor substrate; and
- forming a contact plug which penetrates through the interlayer insulating film and reaches the semiconductor substrate.

BRIEF DESCRIPTION OF THE DRAWINGS

The above features and advantages of the present invention will be more apparent from the following description of certain preferred embodiments taken in conjunction with the accompanying drawings, in which:

FIGS. 18A to 18C show a step in a manufacturing method according to a variation of the first exemplary embodiment.

Figure 1:
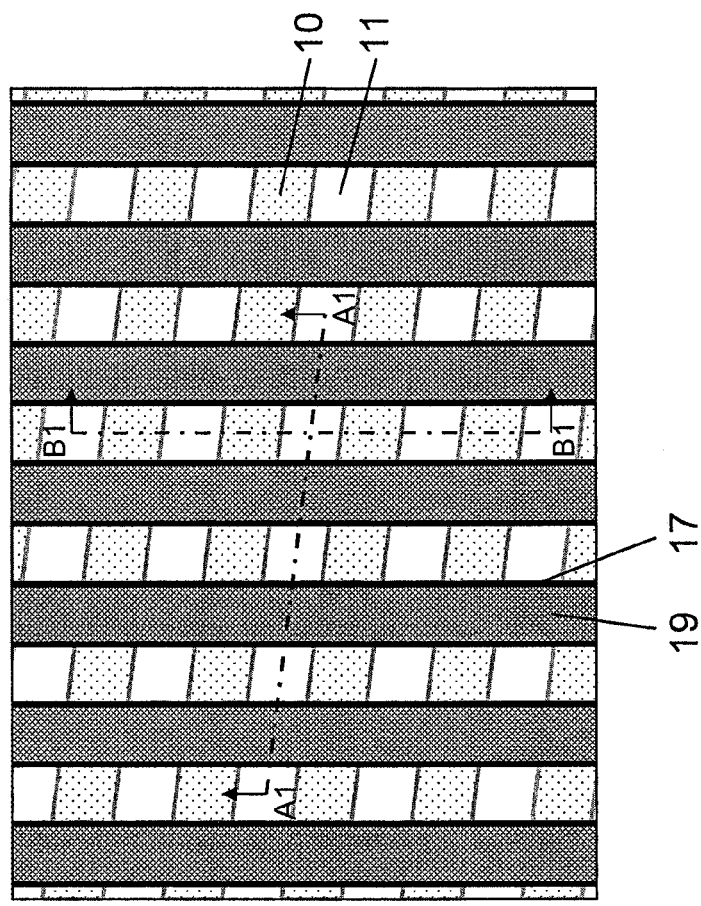
FIG. 1 shows a method for manufacturing a semiconductor device according to a first exemplary embodiment.

In the drawings, numerals have the following meanings: 10: isolation region, 11: active region, 11a: region where p-channel transistor is to be formed, 11b: region where n-channel transistor is to be formed, 14: P-well, 15: N-well, 16: trench, 17: gate insulating film, 19: buried gate electrode, 22: bit contact interlayer insulating film, 23: silicon oxide film, 24: $HfO_2$ film, 25: titanium nitride film, 26, 29: polycrystalline silicon film, 27: $Al_2O_3$ film, 28: photoresist, 30: tungsten nitride film and tungsten film, 31: silicon nitride film, 33: bit line, 34: gate electrode, 36: silicon nitride film, 36a: first insulating film, 37a, 37b: LDD region, 38: aluminum oxide film, 39, 39a, 39b: second insulating film, 40a, 40b: source and drain, 41, 60: silicon nitride film, 42: SOD film, 43: capacitance contact hole, 45: contact hole, 49:

capacitance contact pad, 50: lower electrode, 51: upper electrode, 52: capacitance insulating film, 53: polycrystalline silicon film, 54: LP-TEOS film

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

A first exemplary embodiment relates to a method for manufacturing a semiconductor device including a DRAM (dynamic random access memory) in which a structure of the present invention is applied to first field effect transistors in a peripheral circuit region and bit lines in a memory cell region. In the first exemplary embodiment, the bit lines in a memory cell formation region and the gate electrode of each of the first field effect transistors in a peripheral circuit formation region are formed in the same patterning step.

The method for manufacturing a semiconductor device according to the first exemplary embodiment will be described below with reference to the drawings. In the present specification and the claims, a region where a memory cell region before completion is to be formed, is called a "memory cell formation region," and a region where a peripheral circuit region before completion is to be formed, is called a "peripheral circuit formation region." These regions are distinguished from a "memory cell region" and a "peripheral circuit region" in that the former two regions are not yet completed but are in the course of manufacture.

FIG. 1 is a plan view showing the memory cell formation region. FIG. 2A is a cross-sectional view taken along a plane including the direction A1-A1 in FIG. 1. FIG. 2B is a cross-sectional view taken along a plane including the direction B1-B1 in FIG. 1. FIG. 2C is a cross-sectional view of the peripheral circuit formation region. In the following description, the same relationship between the plan view and the cross-sectional views applies to views unless otherwise specified. An insulating film and other components that cover an upper layer will be omitted as appropriate in order to clearly show components.

Figure 2:
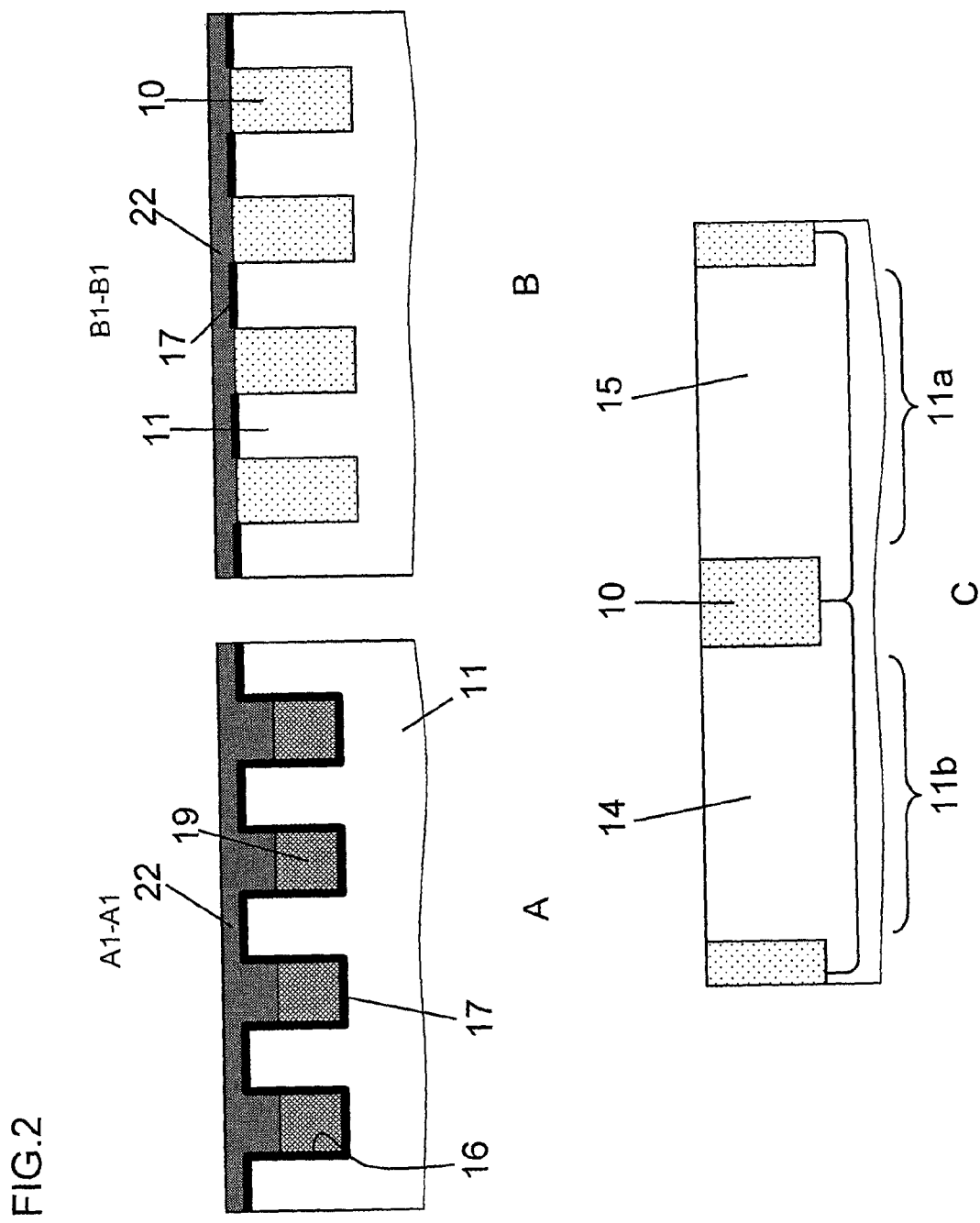
FIGS. 2A to 2C show the method for manufacturing a semiconductor device according to the first exemplary embodiment.

As shown in FIGS. 1 and 2, Isolation regions 10 are first formed in the memory cell formation region and the peripheral circuit formation region of a semiconductor substrate by an STI process. In the thus processed semiconductor substrate, regions partitioned by isolation regions 10 form active regions 11. P-wells 14 and N-wells 15 are then formed in the peripheral circuit formation region by using a known method. Specifically, each P-well 14 is formed in region 11b where an n-channel transistor is to be formed, and each N-well 15 is formed in region 11a where a p-channel transistor is to be formed.

Groove-shaped trenches 16 extending in a direction intersecting isolation regions 10 are subsequently formed in the memory cell formation region by using a known method. The inner wall of each trench 16 is then oxidized in an ISSG (in-situ steam generation) process to form a gate insulating film 17 made of a silicon oxide film. A conductive film is then buried in each trench 16 to form trench-shaped gate electrode 19. Bit contact interlayer insulating film 22 formed of a silicon nitride film is then formed on a principal surface of the semiconductor substrate. Silicon nitride film 22 on the peripheral circuit formation region is removed by a wet etching process.

Figure 3:
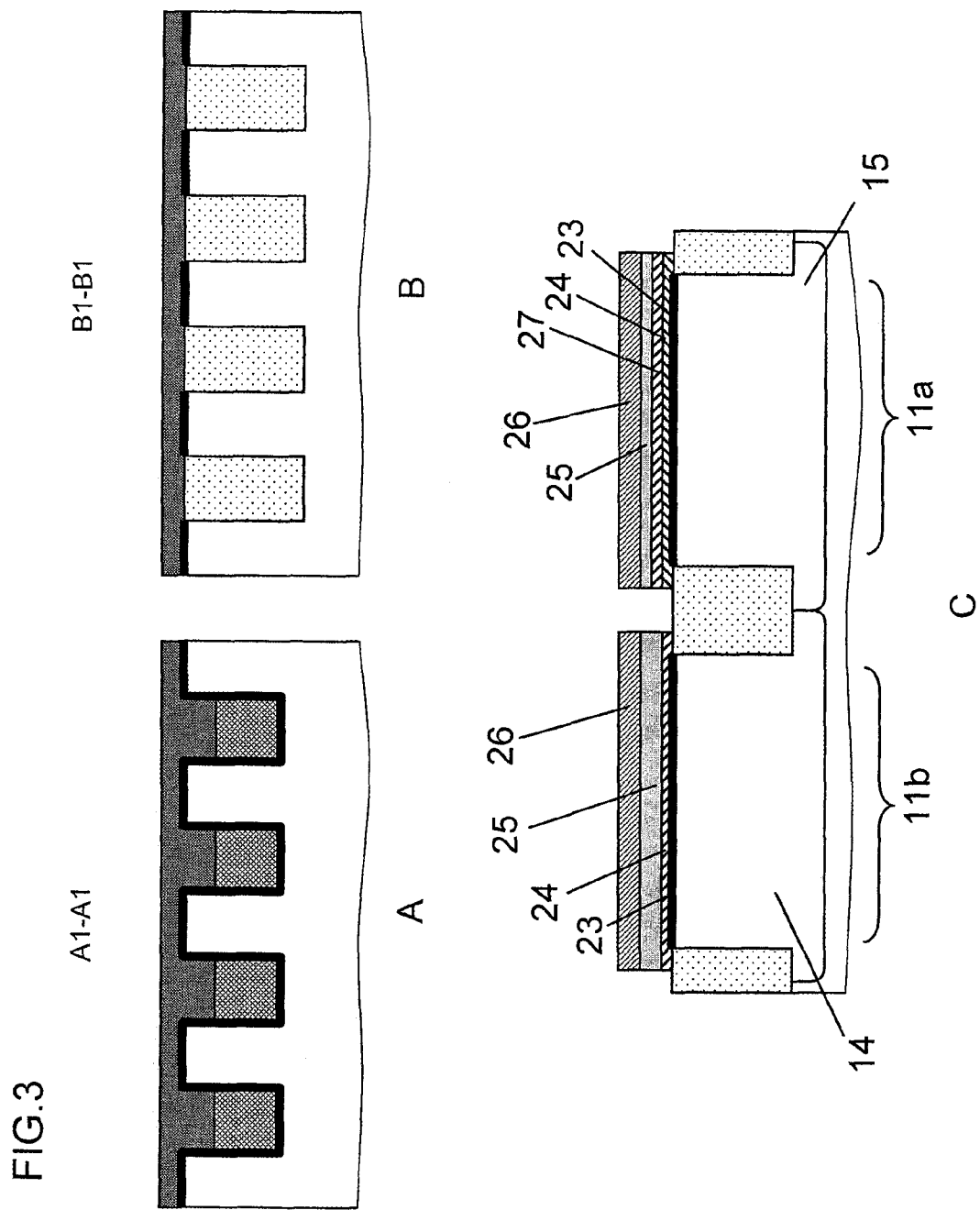
FIGS. 3A to 3C show the method for manufacturing a semiconductor device according to the first exemplary embodiment.

As shown in FIG. 3C, Silicon oxide film 23 is then formed on a principal surface of the peripheral circuit formation region. $HfO_2$ (hafnium oxide) film 24, titanium nitride film (metal film) 25, and polycrystalline silicon film 26 are formed on each P-well 14 sequentially from the side of the semiconductor substrate. Silicon oxide film 23 and $HfO_2$ film 24 form a gate insulating film. $HfO_2$ film 24, $Al_2O_3$ (aluminum oxide) film 27, titanium nitride film (metal film) 25, and polycrystalline silicon film 26 are formed on each N-well 15 sequentially from the side of the semiconductor substrate. Silicon oxide film 23, $HfO_2$ film 24, and $Al_2O_3$ film 27 form a gate insulating film. An insulating film containing hafnium oxide or aluminum oxide has a dielectric constant higher than that of silicon dioxide and is hence called a high dielectric constant insulating film or a high-K insulating film. In the semiconductor device according to the first exemplary embodiment, first field effect transistors including such a high dielectric constant insulating film as a gate insulating film are formed in the peripheral circuit region.

A high dielectric constant gate insulating film is not necessarily made of the materials described above but may be made, for example, of hafnium silicate (HfSiO) or lanthanum oxide ($La_2O_3$). The present invention can be effectively applied to any gate insulating film whose EOT can increase under the influence of an oxidant. A metal film, such as the titanium nitride film described above, is used in some cases as a gate electrode having a close affinity with a high dielectric constant gate insulating film. The metal gate electrode is not limited thereto but may, for example, be a tantalum nitride (TaN) film.

Figure 4:
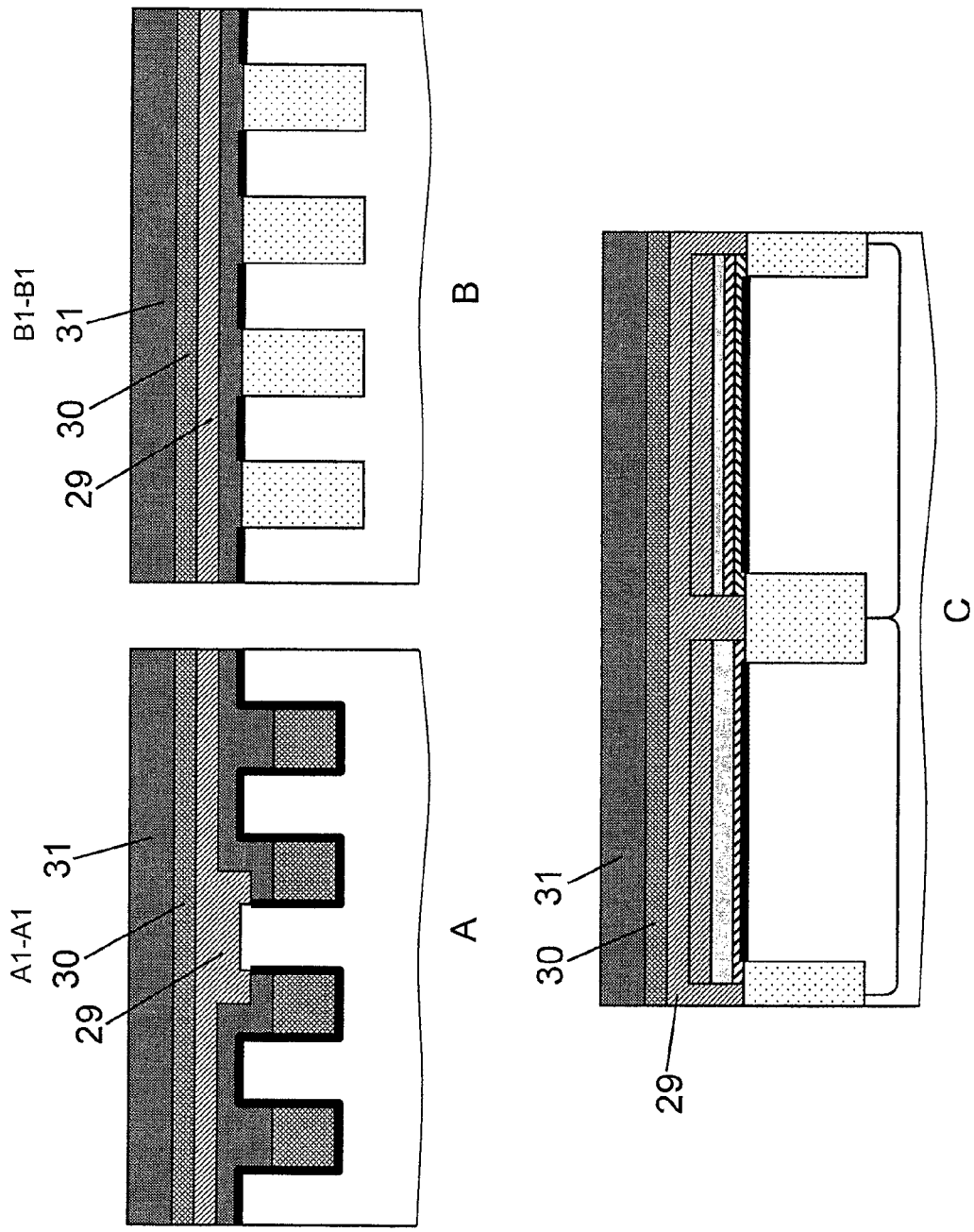
FIGS. 4A to 4C show the method for manufacturing a semiconductor device according to the first exemplary embodiment.

As shown in FIG. 4, part of each active region 11 is then exposed through a bit contact opening by removing part of bit contact interlayer insulating film 22 using photolithography and dry etching processes. Polycrystalline silicon film 29, tungsten nitride film and tungsten film 30 (no boundary between tungsten nitride film and tungsten film is shown in FIGS. 4A to 4C), and silicon nitride film 31 are formed all over the semiconductor substrate. Polycrystalline silicon film 29 and tungsten nitride film and tungsten film 30 form a first conductive film. In the step described above, the first conductive film is formed so that the first conductive film covers the gate electrodes in the peripheral circuit formation region and covers the substrate in the bit contact openings in the memory cell formation region.

Figure 5:
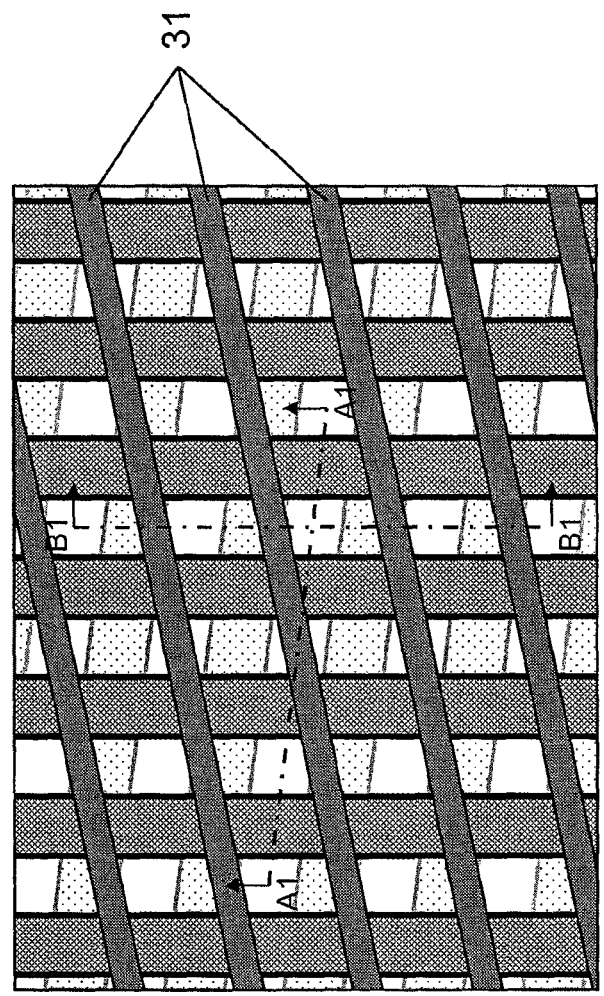
FIG. 5 shows the method for manufacturing a semiconductor device according to the first exemplary embodiment.
Figure 6:
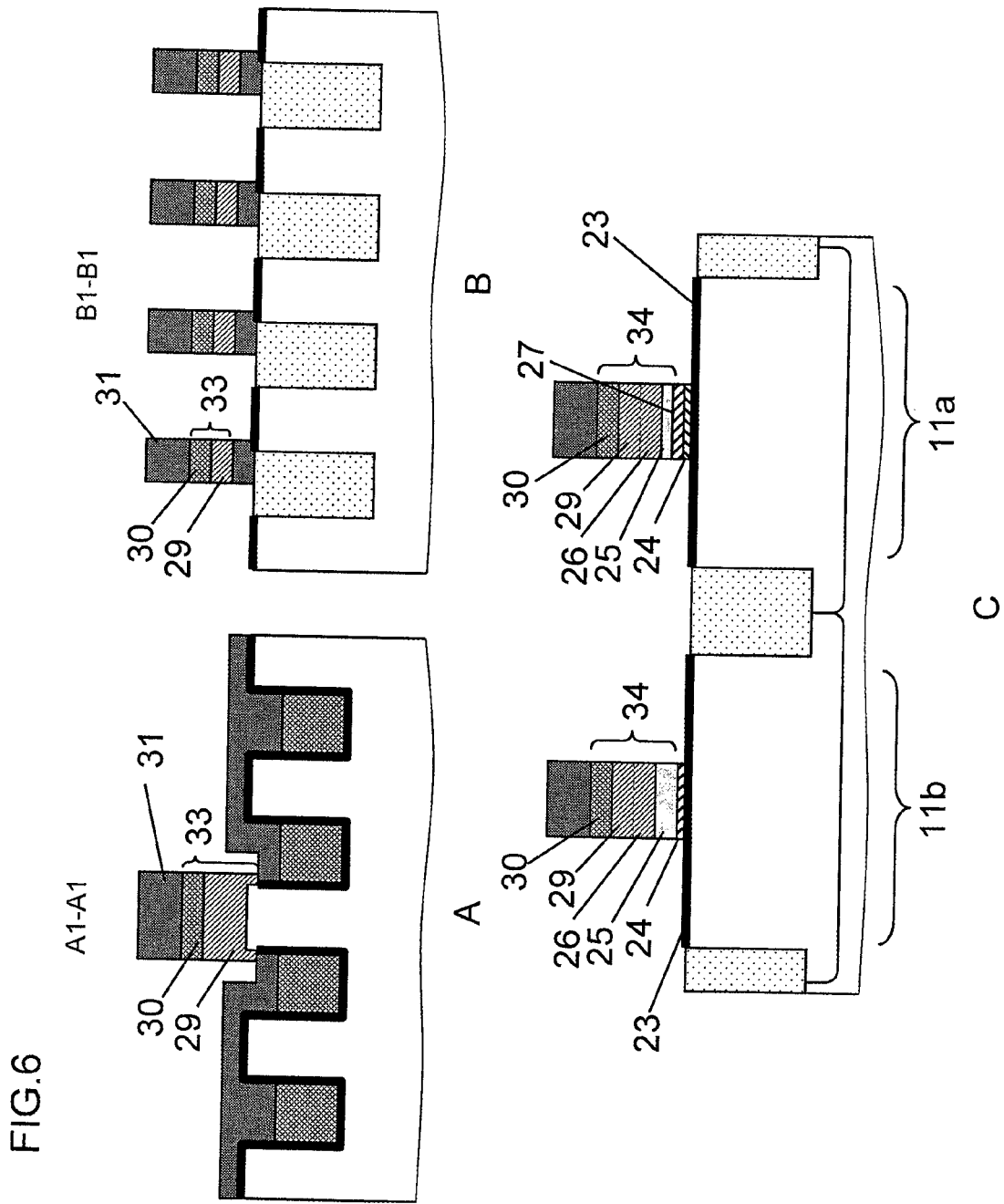
FIGS. 6A to 6C show the method for manufacturing a semiconductor device according to the first exemplary embodiment.

As shown in FIGS. 5 and 6, first silicon nitride film 31, tungsten nitride film and tungsten film 30, polycrystalline silicon films 29, 26, and gate insulating films 24, 27 are processed using photolithography and etching processes and other processes. As a result of the processing, bit lines 33, each of which is formed of polycrystalline silicon film 29 and tungsten nitride film and tungsten film 30, are formed on the memory cell formation region. Further, as a result of the processing, a stacked film formed of the high dielectric constant gate insulating film, titanium nitride film 25, polycrystalline silicon films 26 and 29, and tungsten nitride film and tungsten film 30 is formed on each P-well 14 in the peripheral circuit formation region. On each P-well 14, silicon oxide film 23 and the patterned high dielectric constant insulating film ($HfO_2$ film 24) form the gate insulating film. Titanium nitride film 25, polycrystalline silicon films 26 and 29, and tungsten nitride film and tungsten film 30 form the gate electrode. Moreover, as a result of the processing, a stacked film formed of the high dielectric constant gate insulating film, titanium nitride film 25, polycrystalline silicon films 26 and 29, and tungsten nitride film and tungsten film 30 is formed on each N-well 15 in the peripheral circuit formation region. On each N-well 15, silicon oxide film 23 and the patterned high dielectric constant insulating films (HfO$_2$ film 24 and Al$_2$O$_3$ film 27) form the gate insulating film. Titanium nitride film 25, polycrystalline silicon films 26 and 29, and tungsten nitride film and tungsten film 30 form the gate electrode.

Figure 7:
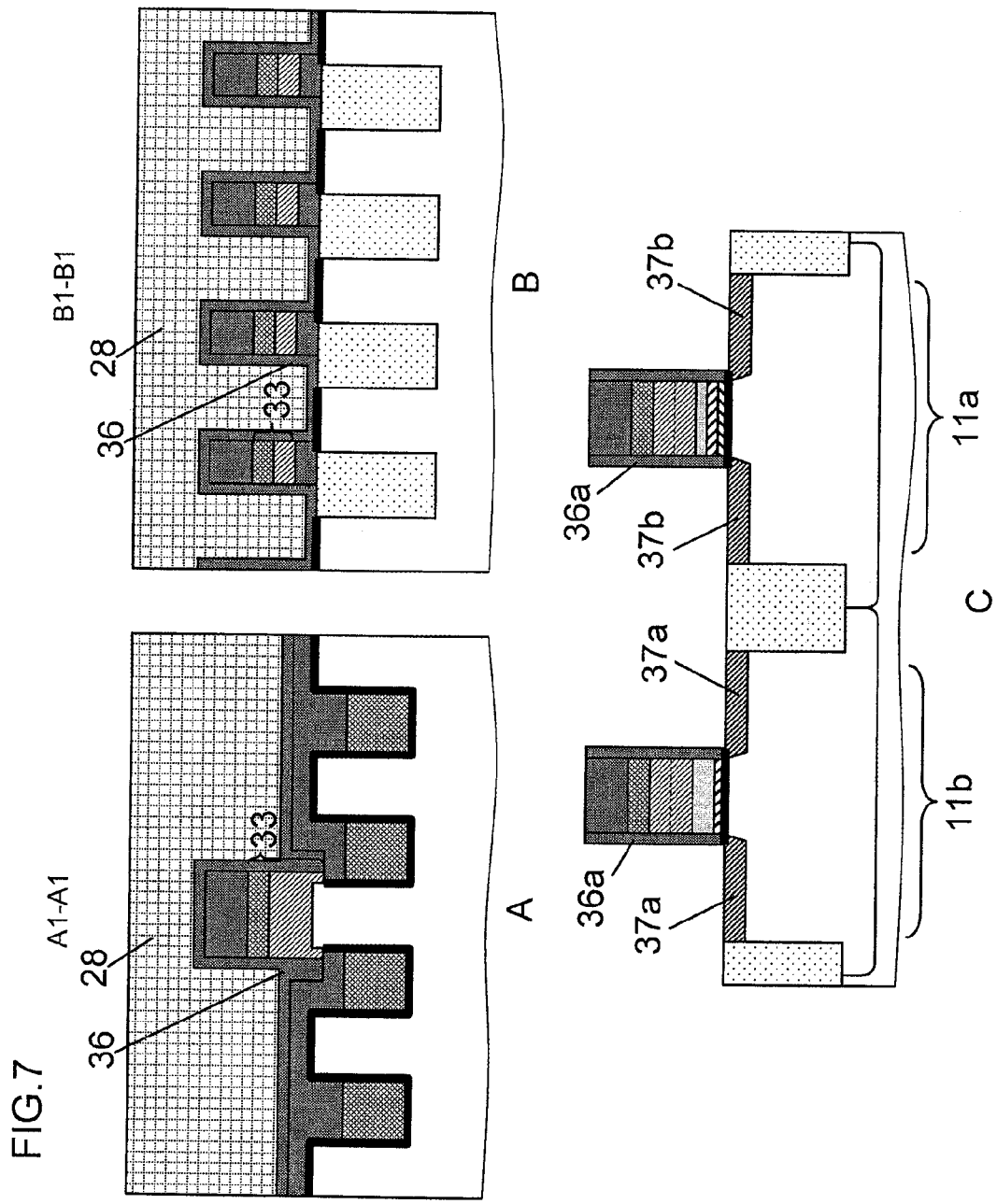
FIGS. 7A to 7C show the method for manufacturing a semiconductor device according to the first exemplary embodiment.

As shown in FIG. 7, silicon nitride film 36 (first insulating film) is then formed all over the semiconductor substrate by an ALD (atomic layer deposition) process. Photoresist 28 is formed all over the semiconductor substrate, and then a photoresist pattern is formed by removing photoresist 28 on the peripheral circuit formation region. Silicon nitride film 36 on the peripheral circuit formation region is etched back, thereby leaving a silicon nitride film, as first insulating film 36 that covers each side surface of the gate insulating films, the gate electrodes, and the hard masks. The memory cell formation region covered with photoresist 28 is not affected by the etching process, and silicon nitride film 36 is formed to cover the plurality of bit lines 33.

After photoresist pattern 28 is removed, and first mask (not shown) is then provided on the memory cell formation region and N-wells 15 in the peripheral circuit formation region. N-conductive-type impurities are ion-implanted into P-wells 14 in the peripheral circuit formation region by using hard mask 31, first insulating film 36a, and the first mask to form LDD region 37a on both sides of and below each of the gate electrodes. After the first mask is removed, a second mask (not shown) is provided on the memory cell formation region and the P-wells 14 in the peripheral circuit formation region. P-conductive-type impurities are ion-implanted into N-wells 15 in the peripheral circuit formation region by using hard mask 31, first insulating film 36a, and the second mask to form LDD region 37b on both sides and below each of the gate electrodes. The second mask is then removed.

Figure 8:
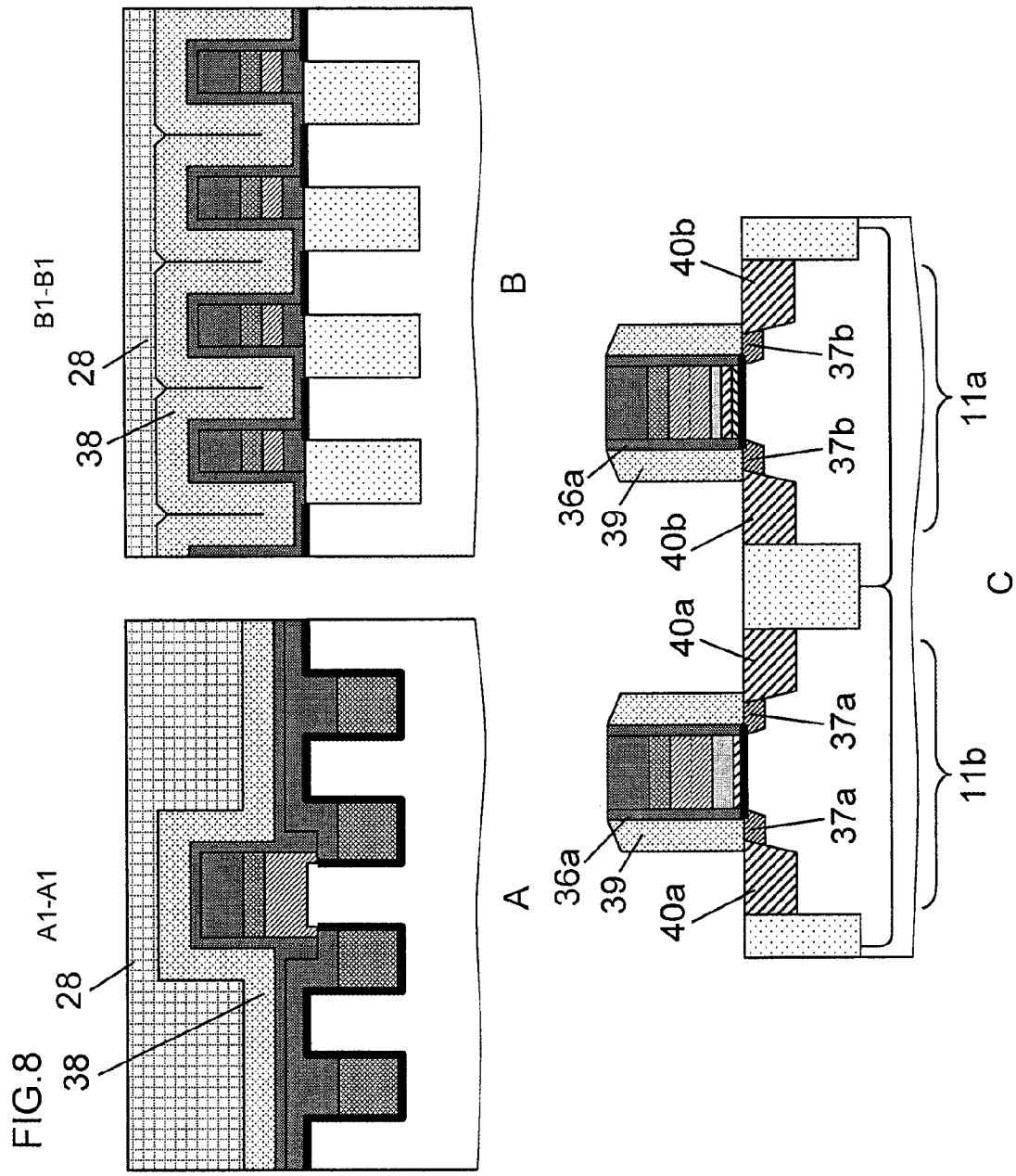
FIGS. 8A to 8C show the method for manufacturing a semiconductor device according to the first exemplary embodiment.

As shown in FIG. 8, aluminum oxide film 38 (second insulating film) is then formed all over the semiconductor substrate. Photoresist 28 is formed all over the semiconductor substrate, and then photoresist 28 on the peripheral circuit formation region is removed to form a photoresist pattern. Aluminum oxide film 38 on the peripheral circuit formation region is etched back, thereby leaving an aluminum oxide film, as second insulating film 39 that covers each side surface of the gate electrodes and the hard masks and covers each first insulating film 36a. A sidewall formed of first insulating film 36a and second insulating film 39 is thus formed. The memory cell formation region covered with photoresist 28 is not affected by the etching process, and aluminum oxide film 38 is formed in order to be buried in the spaces between the plurality of bit lines 33.

After photoresist pattern 28 is removed, a third mask (not shown) is provided on the memory cell formation region and N-wells 15 in the peripheral circuit formation region. N-conductive-type impurities of high concentration are ion-implanted into P-wells 14 in the peripheral circuit formation region by using hard mask 31, first and second insulating films 36a, 39, and the third mask. Source and drain 40a are thus formed on both sides and below each of the gate electrodes. After the third mask is removed, a fourth mask (not shown) is provided on the memory cell formation region and P-wells 14 in the peripheral circuit formation region. P-conductive-type impurities of high concentration are ion-implanted into N-wells 15 in the peripheral circuit formation region by using hard mask 31, first and second insulating films 36a, 39, and the fourth mask. Source and drain 40b are thus formed on both sides and below each of the gate electrodes. The fourth mask is then removed.

Figure 9:
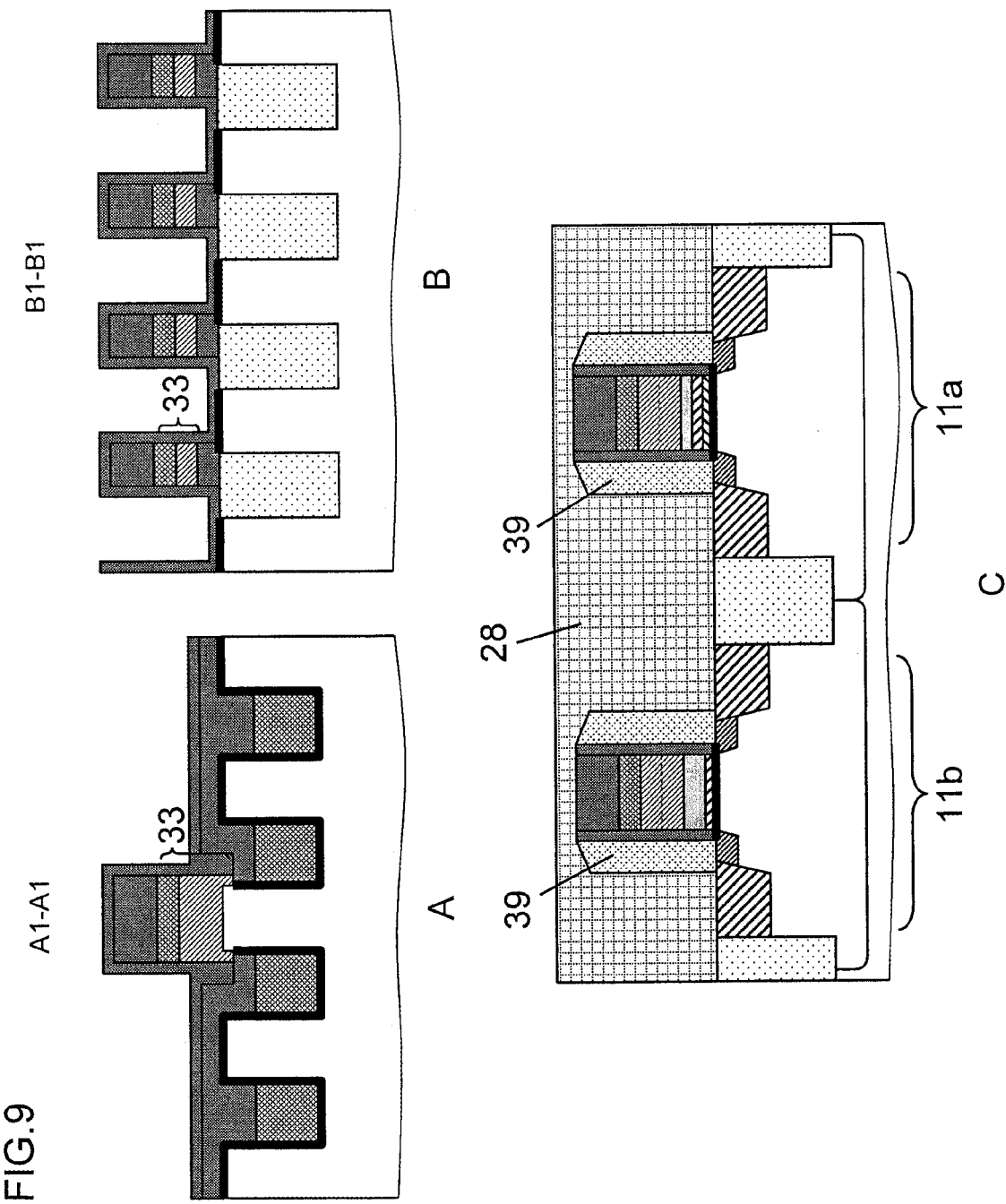
FIGS. 9A to 9C show the method for manufacturing a semiconductor device according to the first exemplary embodiment.

As shown in FIG. 9, photoresist 28 is subsequently formed all over the semiconductor substrate, and then the photoresist on the memory cell formation region is removed to form a photoresist pattern. Aluminum oxide film 38 on the memory cell formation region is removed by a wet etching process using the photoresist pattern as a mask. Since aluminum oxide film 38 and silicon nitride film 36 are insulating films different from each other, aluminum oxide film 38 buried in the spaces between bit lines 33 in the memory cell formation region can be selectively removed from silicon nitride film 36 that covers bit lines 33. From this point of view, the material of the first insulating film formed to cover bit lines 33 in the memory cell formation region is not limited to silicon nitride but may be any material that is not aluminum oxide (to selectively remove second insulating film) and forms an insulating film that does not contribute as an oxidant. The photoresist pattern is then removed.

Figure 10:
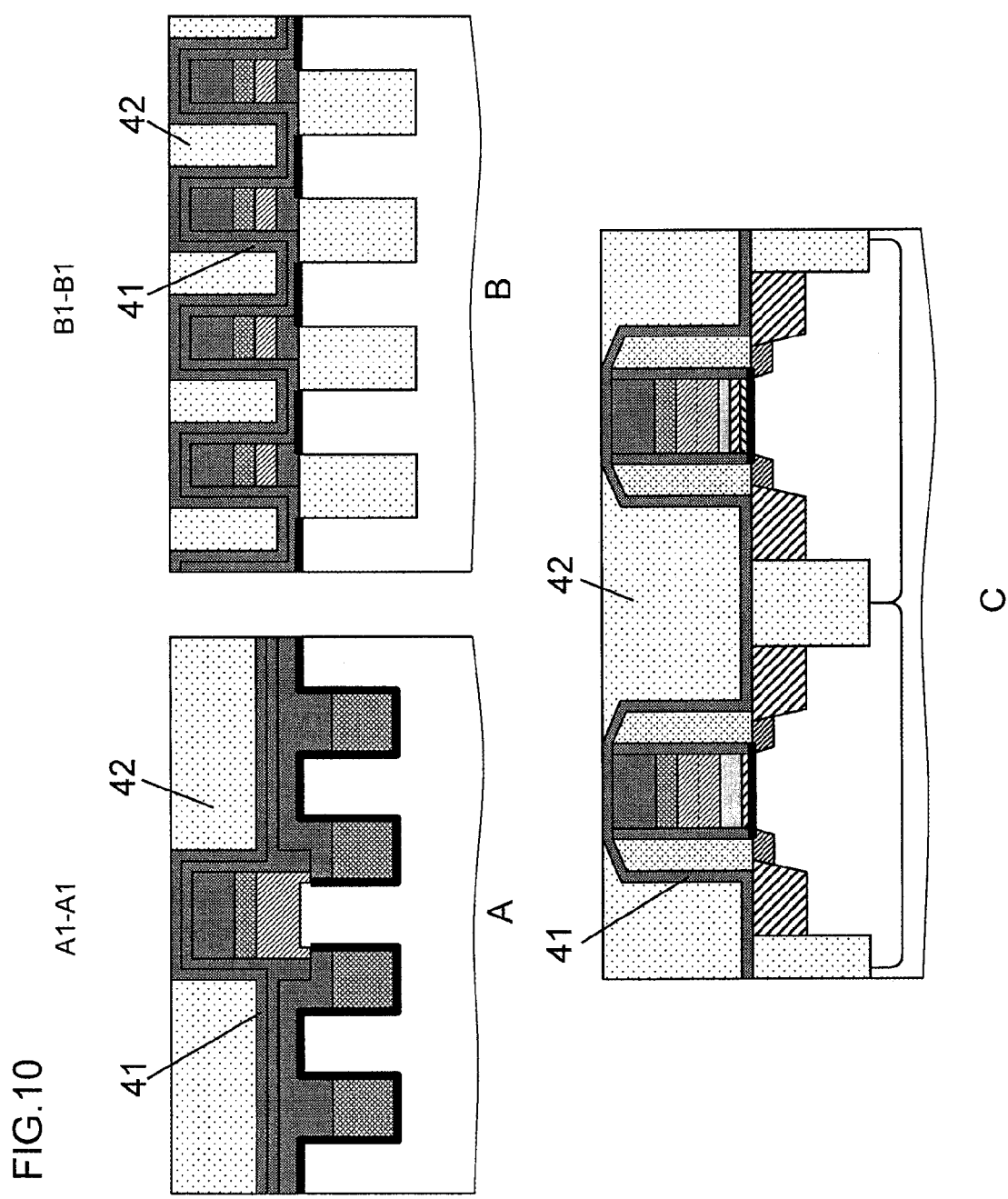
FIGS. 10A to 10C show the method for manufacturing a semiconductor device according to the first exemplary embodiment.

As shown in FIG. 10, silicon nitride film 41 is then formed as a liner film all over the semiconductor substrate by a CVD process. In this process, silicon nitride film 41 can be formed without completely burying silicon nitride film 41 in the spaces between the bit lines because aluminum oxide film 38 on the memory cell formation region has been removed. As a result, silicon nitride film 41 can be used as an etching stopper when capacitance contact holes are opened in the step shown in FIG. 11, which will be described later. SOD film (spin on dielectric, interlayer insulating film) 42 is then formed, followed by thermal treatment. SOD film 42 is planarized by performing CMP thereon using liner film 41 as a stopper.

Figure 11:
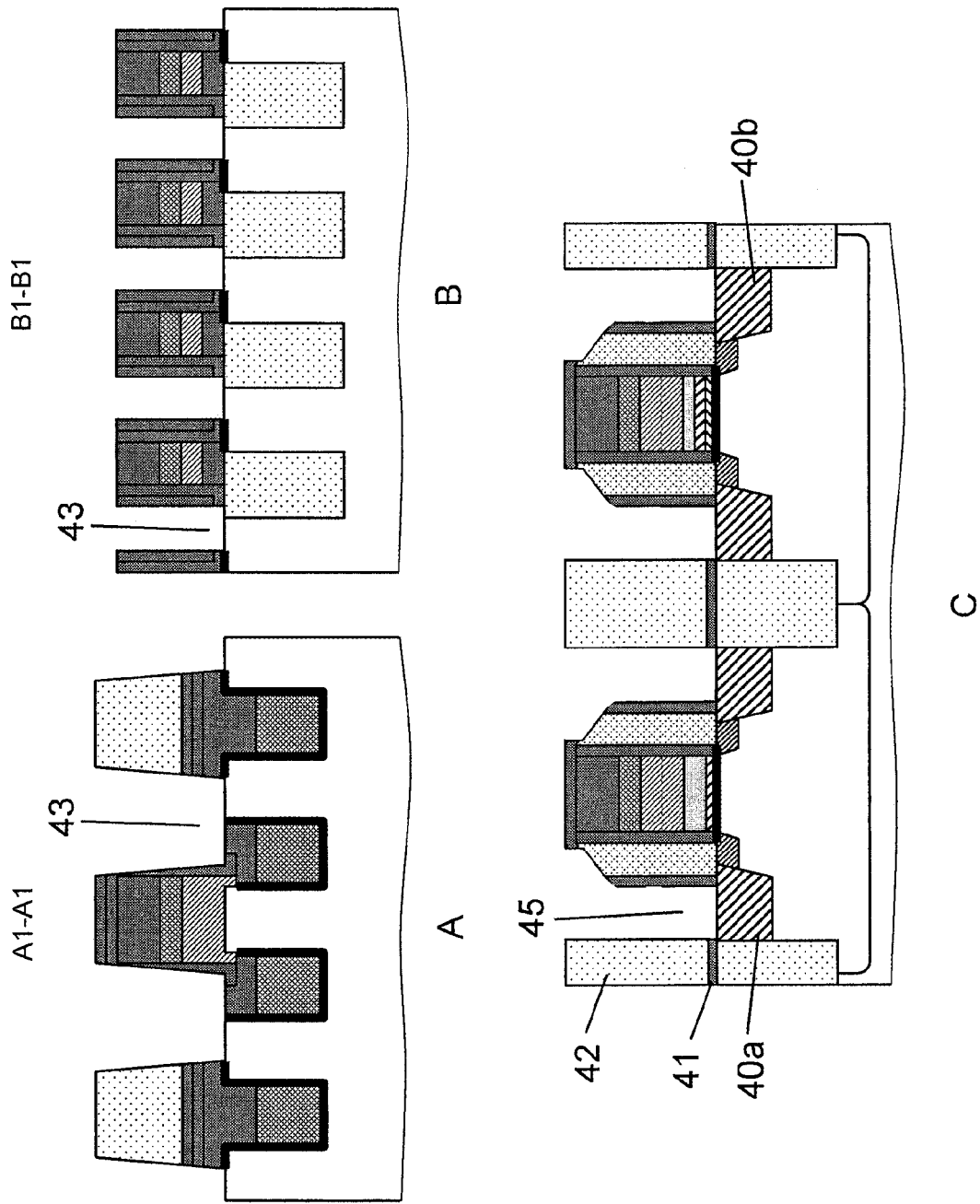
FIGS. 11A to 11O show the method for manufacturing a semiconductor device according to the first exemplary embodiment.

As shown in FIG. 11, capacitance contact holes 43 and contact holes 45 are formed in the interlayer insulating film formed of SOD film 42 using photolithography and etching processes. Specifically, in the memory cell formation region, capacitance contact holes 43 are formed in the interlayer insulating film made of SOD film 42 so that capacitance contact holes 43 penetrate through the interlayer insulating film 42 from the surface of the interlayer insulating film to active regions 11 (principal surface of substrate that forms source or drain region) positioned between bit lines 33. Liner film 41 and silicon nitride film 36 function as dry etching protective films, and capacitance contact holes 43 can be formed in the spaces between bit lines 33 in a self-aligned manner.

Figure 12:
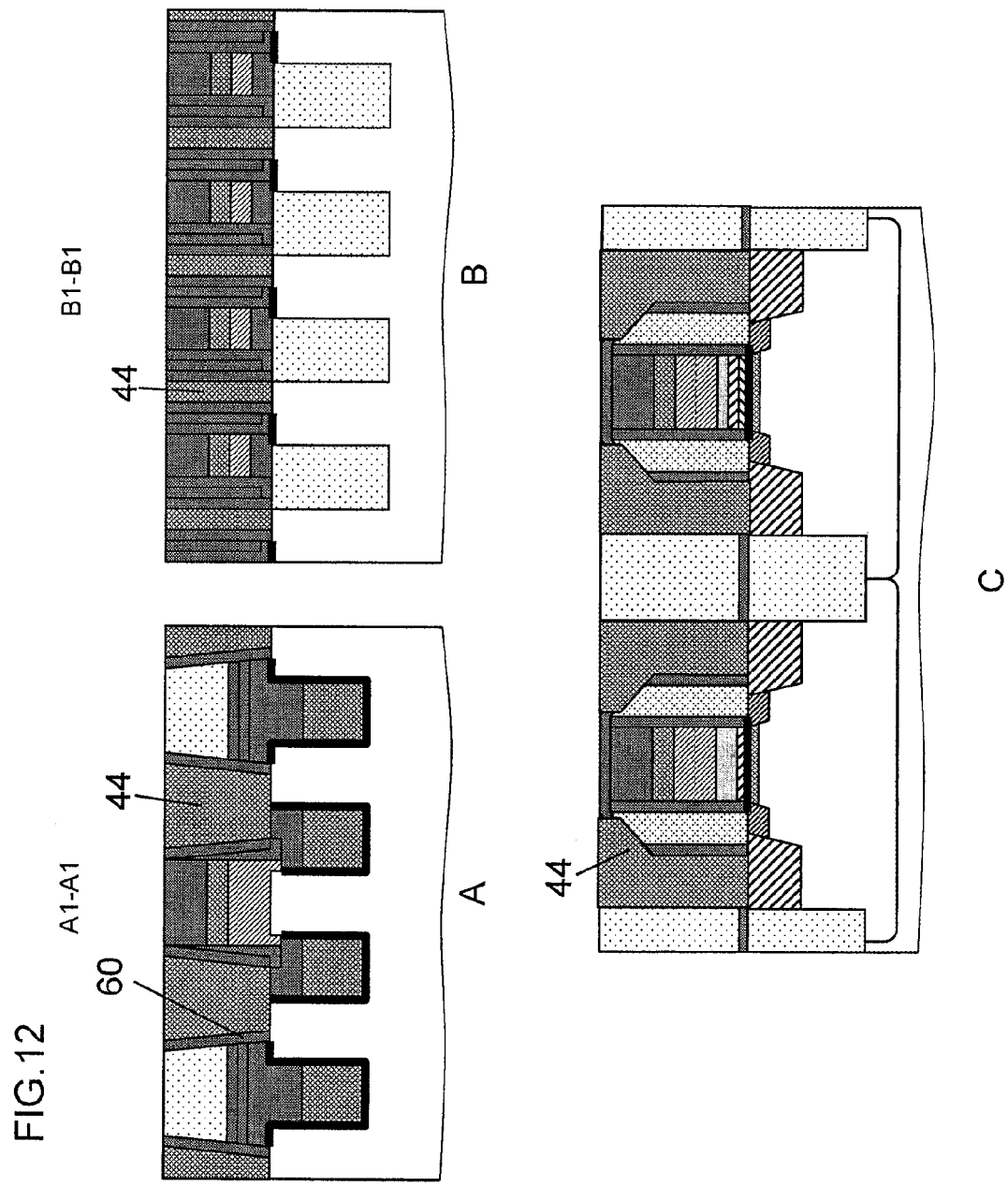
FIGS. 12A to 12C show the method for manufacturing a semiconductor device according to the first exemplary embodiment.

As shown in FIG. 12, contact plugs 44 are subsequently formed by burying a conductive film in capacitance contact holes 43 and contact holes 45 by using a known technique. In this process, sidewall film 60 made of silicon nitride may be formed in advance on the side surface of each capacitance contact hole 43, as shown in FIG. 12.

Figure 13:
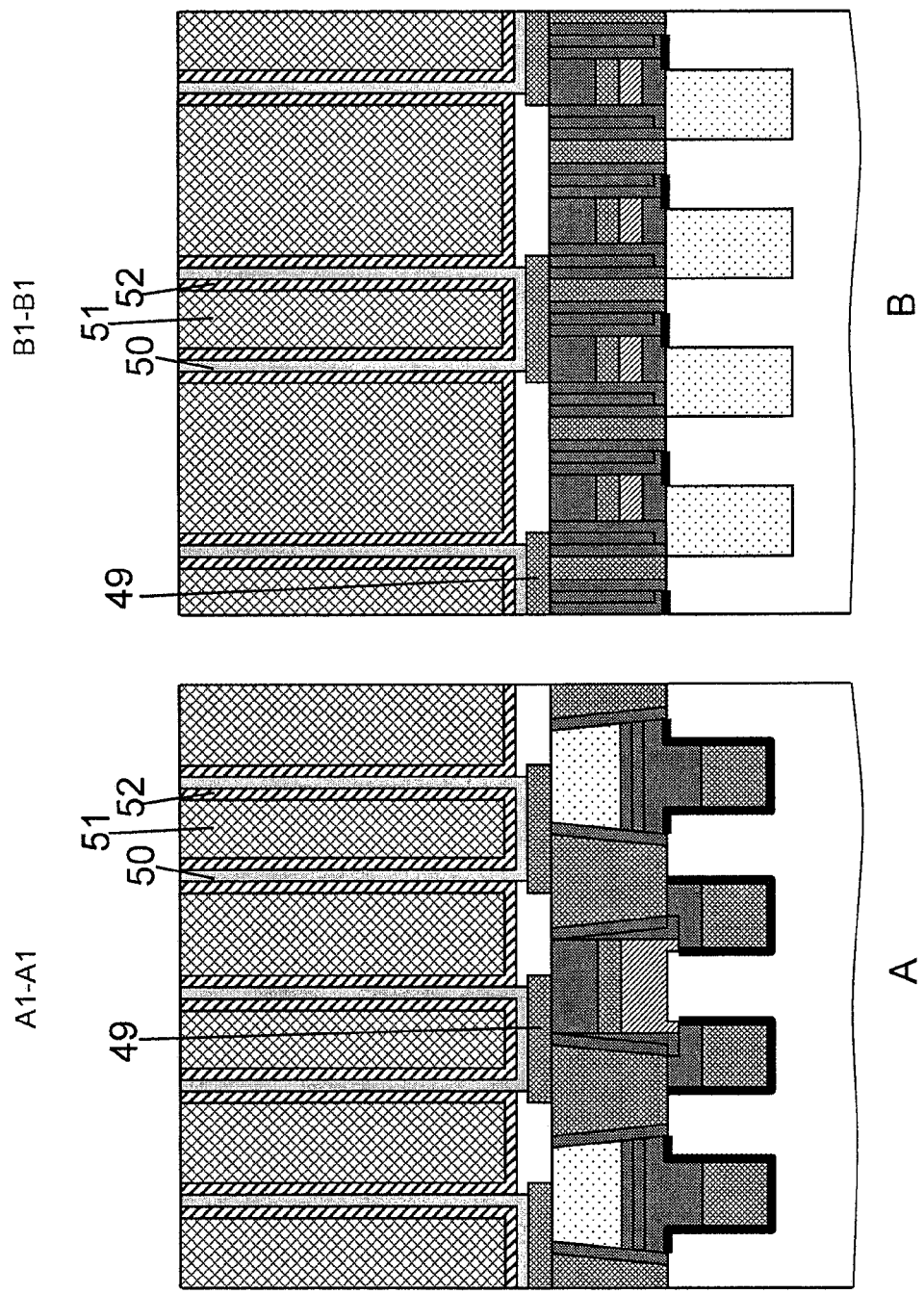
FIGS. 13A and 13B show the method for manufacturing a semiconductor device according to the first exemplary embodiment.

Subsequently, as shown in FIG. 13, capacitance contact pads 49 electrically connected to the capacitance contact plugs are formed in the memory cell formation region by using a known method, and wirings electrically connected to sources and drains 40a, 40b are formed in the peripheral circuit formation region by using a known method. Crown-shaped capacitors are subsequently formed in the memory cell formation region by using a known method. Each of the capacitors is formed of lower electrode 50, capacitance insulating film 52, and upper electrode 51. The capacitors are electrically connected to respective capacitance contact pads 49. The semiconductor device according to the first exemplary embodiment comprising a DRAM including capacitors, field effect transistors, and bit lines is thus completed.

In the memory cell region of the semiconductor device according to the first exemplary embodiment, second field effect transistors each of which includes trench-shaped gate electrode 19, gate insulating film 17, and the source and the drain provided in the semiconductor substrate are provided. Bit lines 33 are provided in the interlayer insulating film on the semiconductor substrate so that they are electrically connected to the source or drain region of the respective second field effect transistors. Each bit line 33 includes polycrystalline silicon film 29 and tungsten nitride film and tungsten film 30 sequentially formed from the side of the source or drain region. Hard mask 31 made of a silicon nitride film is provided on each bit line 33.

Further, capacitance contact plugs 44 are provided so that they are connected to the source or drain region of the respective second field effect transistor. Bit lines 33 and capacitance contact plugs 44 are electrically isolated from each other by respective first insulating films 36a and sidewall films 60. Respective capacitance contact plugs 44 are electrically connected to the respective capacitors with interposed respective capacitance contact pads 49 therebetween. Each of the capacitors is formed of lower electrode 50, capacitance insulating film 52, and upper electrode 51.

In the peripheral circuit region, the planar n-channel and p-channel type first field effect transistors are formed. The first transistor of each of the channel types includes a gate insulating film and a gate electrode sequentially provided on the semiconductor substrate. The gate insulating film of each of the n-channel type first transistors is formed of silicon oxide film 23 and the high dielectric constant film (high-K film) made of $HfO_2$ film 24, and the gate insulating film of each of the p-channel type first transistors is formed of silicon oxide film 23 and the high dielectric constant film (high-K film) made of $HfO_2$ film 24 and $Al_2O_3$ film 27. The gate electrode of each of the n-channel and p-channel type first transistors is formed of titanium nitride film 25, polycrystalline silicon films 26 and 29, and tungsten nitride film and tungsten film 30, and hard mask 31 is provided on the gate electrode. On side surfaces of the gate insulating film and the gate electrode of each of the n-channel and p-channel type first transistors, a silicon nitride film is formed as first insulating film 36a used to form the LDD region and an aluminum oxide film is formed as second insulating film 39 used to form the source and drain regions.

In the semiconductor device according to the first exemplary embodiment, the aluminum oxide film provided as second insulating film 39 in each of the first field effect transistors in the peripheral circuit region prevents any oxidant from being introduced into the gate electrode and the gate insulating film. As a result, increase in EOT of the gate insulating film and induction of negative fixed charge due to an introduced oxidant can be suppressed in the first field effect transistors in the peripheral circuit region. Accordingly, variation in threshold voltage and decrease in the magnitude of on-state current can be suppressed.

Depending on the configuration of the semiconductor device, the interval between the bit lines in the memory cell region is narrower than the interval between the gate electrodes of the transistors in the peripheral circuit region in some cases. In this case, the insulating films for the sidewalls in the peripheral circuit region disadvantageously bury the spaces between the bit lines in the memory cell region. Before the formation of the capacitance contact plugs between the bit lines, a liner film (silicon nitride film) is formed as an etching stopper against dry etching for forming the capacitance contact hole in the interlayer insulating film (silicon oxide film). To form the liner film, the insulating film for the sidewalls buried in the spaces between the bit lines needs to be removed isotropically in a wet etching process.

In a related method for manufacturing a semiconductor device, the liner film and the sidewall insulating films are made of a silicon nitride film. In this case, the liner film is also removed when the sidewall insulating films are removed by the wet etching process, and the bit lines may disadvantageously be affected by the wet etching process.

In contrast, in the first exemplary embodiment, since the liner film is made of a silicon nitride film and the aluminum oxide film is buried in the spaces between the bit lines, the buried film (aluminum oxide film) can be selectively removed. In this case, there is no problem that the bit lines is etched by the wet etching process.

As described above, according to the first exemplary embodiment, it is possible to suppress degradation in element characteristics due to the influence of an oxidant on the gate electrodes and the gate insulating films and to remove the insulating films buried in the spaces between the bit lines selectively. Accordingly, miniaturization of the elements can be achieved.

In the first exemplary embodiment, second insulating film 39 made of an aluminum oxide film is formed. As a variation of the first exemplary embodiment, second insulating film 39 may alternatively be formed of a silicon oxide film and an aluminum oxide film. In the variation, after the steps shown in FIGS. 1 to 7 in the first exemplary embodiment are carried out, an aluminum oxide film and a silicon oxide film are sequentially formed on the semiconductor substrate, as shown FIG. 18. A mask is formed on the memory cell formation region, and then the aluminum oxide film and the silicon oxide film are etched back by a wet etching process. As a result, aluminum oxide film 39a and silicon oxide film 39b are formed as the second insulating film on side surfaces of each of the gate electrodes in the peripheral circuit formation region. In the wet etching process, the same steps as those shown in FIG. 9 in the first exemplary embodiment are carried out except that the aluminum oxide film and the silicon oxide film on the memory cell formation region are removed. Thereafter, the steps shown in FIGS. 10 to 13 in the first exemplary embodiment are carried out. The semiconductor device is thus completed.

In the variation as well, aluminum oxide film 39a prevents oxygen from diffusing from silicon oxide film 39b and the SOD film into the gate structure in the peripheral circuit region. Accordingly, the same advantageous effects as those provided in the first exemplary embodiment can be gotten.

Second Exemplary Embodiment

A second exemplary embodiment differs from the first exemplary embodiment in terms of the following points:
(a) In the peripheral circuit formation region, a silicon oxide film is formed as each gate insulating film.
(b) The gate insulating films and polycrystalline silicon films are formed in the peripheral circuit formation region before the trench-shaped gate electrodes are formed in the memory cell formation region.

In the following section, a method for manufacturing a semiconductor device according to the second exemplary embodiment will be described. The same steps as those in the first exemplary embodiment will not be described.

Figure 14:
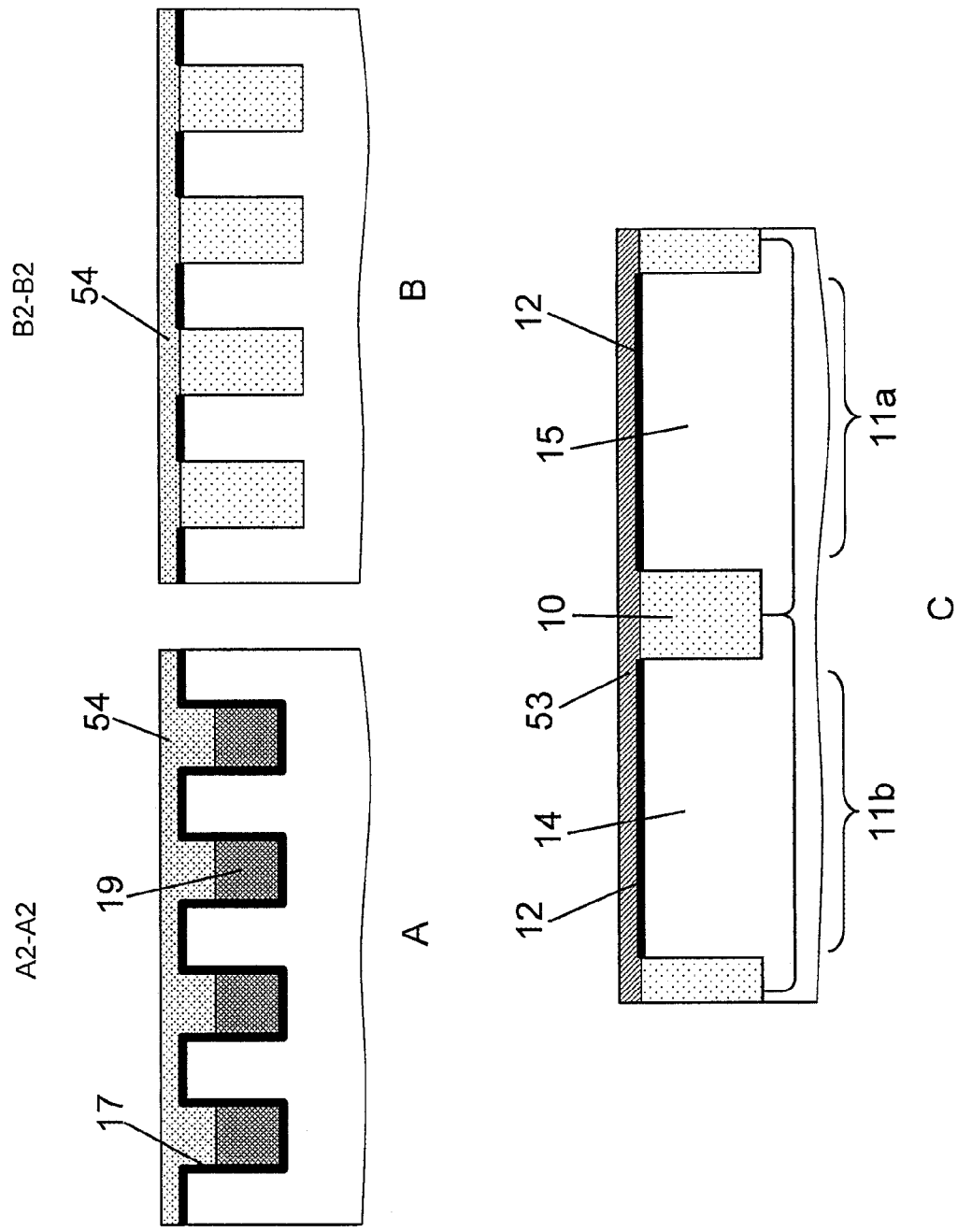
FIGS. 14A to 14C show a method for manufacturing a semiconductor device according to a second exemplary embodiment.

First, as shown in FIG. 14, by using the method used in the first exemplary embodiment and described with reference to FIG. 2, isolation regions 10 are formed in the memory cell formation region and the peripheral circuit formation region of a semiconductor substrate. P-wells 14 and N-wells 15 are formed in the peripheral circuit formation region. Specifically, each P-well 14 is formed in region 11b where an n-channel transistor is to be formed and each N-well 15 is formed in region 11a where a p-channel transistor is to be formed. Silicon oxide film 12 (gate insulating film) is then formed on the surfaces of N-wells 15 and P-wells 14 in the peripheral circuit formation region in the known ISSG process. Polycrystalline silicon film 53 is formed all over the semiconductor substrate by a CVD process, and then a fifth mask is formed on the peripheral circuit formation region. Polycrystalline silicon film 53 on the memory cell formation region is subsequently removed by known photolithography and etching processes, thereby leaving that polycrystalline silicon film 53 in the peripheral circuit formation region.

Trenches 16, gate insulating film 17, and trench-shaped gate electrodes 19 are then formed in the memory cell formation region by using the same method used in the first exemplary embodiment and described with reference to FIG. 2. LP-TEOS (low pressure-tetra ethyl ortho silicate, TEOS stands for $Si(OC_2H_5)_4$) film 54 is then formed all over the semiconductor substrate. LP-TEOS film 54 in the peripheral circuit formation region is then removed by using a known photolithography technique. LP-TEOS film 54 in the second exemplary embodiment functions as bit contact interlayer insulating film 22 in the first exemplary embodiment described above.

Figure 15:
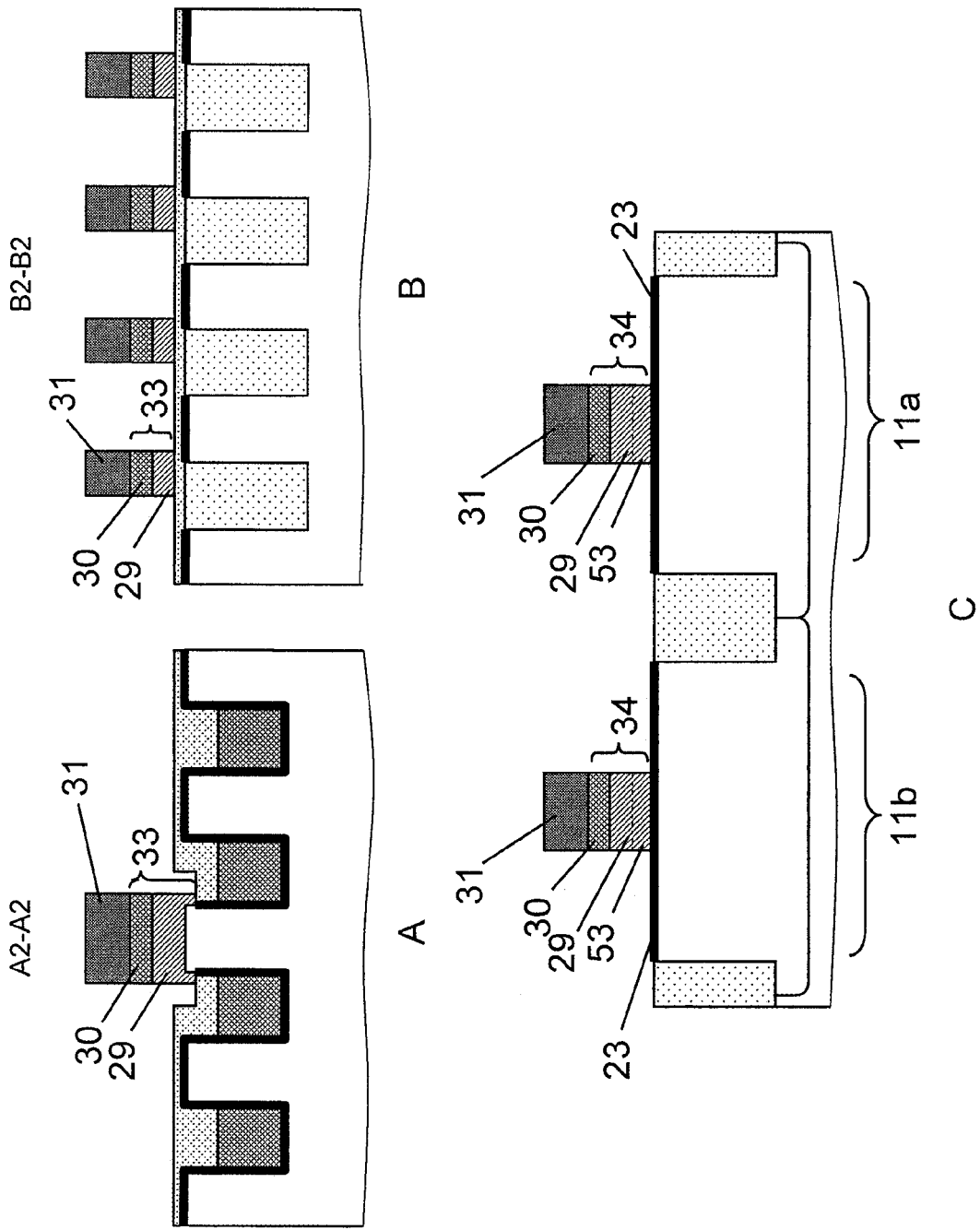
FIGS. 15A to 15C show the method for manufacturing a semiconductor device according to the second exemplary embodiment.

The structure shown in FIG. 15 is then formed by using the same methods used in the first exemplary embodiment and described with reference to FIGS. 3 to 6. Components shown in FIG. 15 having the same reference characters as those shown in FIGS. 3 to 6 are formed or processed by the same methods used therein. As a result of the processing described above, bit lines 33 made of polycrystalline silicon film 29 and tungsten nitride film and tungsten film 30 are formed in the memory cell formation region. Further, as a result of the processing described above, a stacked film made of silicon oxide film 12, polycrystalline silicon films 29 and 53, and tungsten nitride film and tungsten film 30 is formed on each P-well 14 in the peripheral circuit formation region. Moreover, as a result of the processing described above, a stacked film made of silicon oxide film 12, polycrystalline silicon films 29 and 53, and tungsten nitride film and tungsten film 30 is formed on each N-well 15 in the peripheral circuit formation region.

Figure 16:
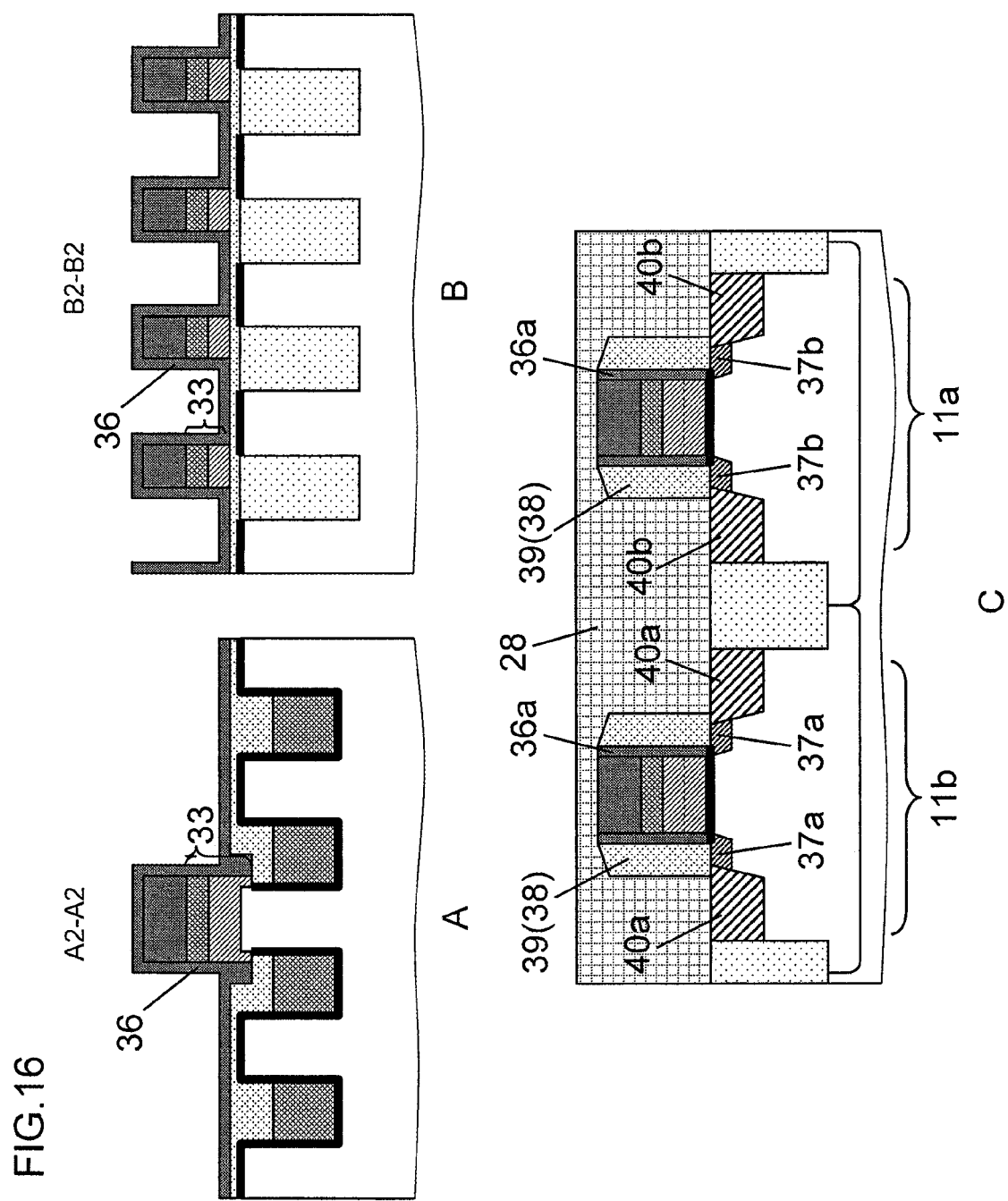
FIGS. 16A to 16C show the method for manufacturing a semiconductor device according to the second exemplary embodiment.

As shown in FIG. 16, silicon nitride film 36, first insulating film 36a, LDD regions 37a, 37b, aluminum oxide film 38, and sources and drains 40a, 40b are formed by using the same methods used in the first exemplary embodiment and described with reference to FIGS. 7 to 9. Aluminum oxide film 38 buried in the spaces between bit lines 33 in the memory cell formation region is removed by a wet etching process by using the same method described with reference to FIG. 9. In this process, since aluminum oxide film 38 and silicon nitride film 36 are insulating films different from each other, aluminum oxide film 38 buried in the spaces between bit lines 33 in the memory cell formation region can be selectively removed from silicon nitride film 36 that covers bit lines 33. From this point of view, the material of the first insulating film formed to cover bit lines 33 in the memory cell formation region is not limited to silicon nitride but may be any insulating material that is not aluminum oxide (to selectively remove second insulating film) and that does not contribute as an oxidant.

Figure 17:
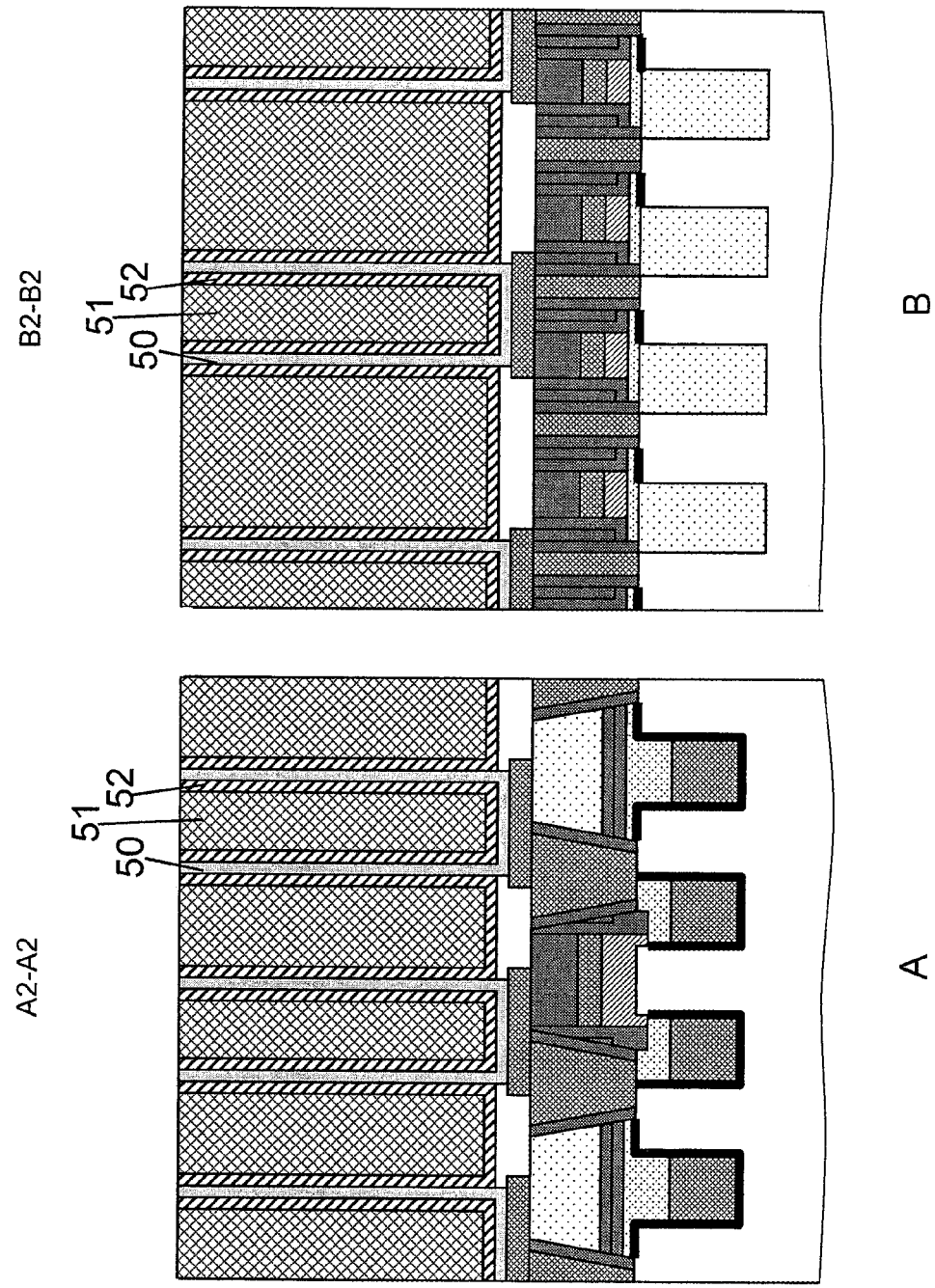
FIGS. 17A and 17B show the method for manufacturing a semiconductor device according to the second exemplary embodiment.

The semiconductor device according to the second exemplary embodiment is subsequently completed by using the same methods used in the first exemplary embodiment and described with reference to FIGS. 10 to 13. FIGS. 17A and 17B are cross-sectional views showing the memory cell region of the semiconductor device according to the second exemplary embodiment. As shown in FIG. 17, in the semiconductor device according to the second exemplary embodiment, unlike the semiconductor device according to the first exemplary embodiment, n-channel and p-channel type first field effect transistors in the peripheral circuit region comprise the gate insulating film made of a silicon oxide film. Further, the gate electrode of each first field effect transistor is made of a polycrystalline silicon film, a tungsten nitride film, and a tungsten film. In the semiconductor device according to the second exemplary embodiment, the other basic components are the same as those of the semiconductor device according to the first exemplary embodiment. Accordingly, the aluminum oxide film as the second insulating film formed in the peripheral circuit region prevents any oxidant from being introduced into the gate electrodes and the gate insulating films. As a result, it is possible to suppress increase in EOT of the gate insulating films and induction of negative fixed charge can be suppressed, thereby inhibiting variation in threshold voltage and decrease in the magnitude of on-state current. Further, in the steps of manufacturing the semiconductor device according to the second exemplary embodiment, even when the interval between the bit lines formed in the memory cell region is narrow, the aluminum oxide film for a sidewall buried in each space between the bit lines can be selectively removed. As a result, miniaturization of the elements can be achieved.

It is apparent that the present invention is not limited to the above embodiments, but may be modified and changed without departing from the scope and spirit of the invention.

What is claimed is:

1. A semiconductor device comprising: a semiconductor substrate;
    a peripheral circuit region including a first transistor, the first transistor including a gate insulating film and a gate electrode on the semiconductor substrate;
    a memory cell region including a memory cell which includes a second transistor having a trench gate electrode, and a memory element comprising a capacitor electrically connected to the second transistor by a memory contact plug;
    a first sidewall on a side surface of the gate electrode of the first transistor, the first sidewall including a first insulating film and a second insulating film on the first insulating film and containing a metal oxide different from the first insulating film, the second insulating film not being present over a top of the gate electrode of the first transistor;
    an interlayer insulating film on the semiconductor substrate; and a contact plug which directly contacts the second insulating film at a top of said first sidewall and penetrates through the interlayer insulating film and reaches the semiconductor substrate, wherein
    the second insulating film is not present in the second transistor of the memory cell region, and
    the memory contact plug directly contacts the first insulating film which is present on a second sidewall on a side surface of the gate electrode of the second transistor.

2. The semiconductor device according to claim 1, wherein the gate insulating film includes an insulating film which has a dielectric constant higher than a dielectric constant of silicon oxide.

3. The semiconductor device according to claim 1, wherein the gate electrode includes a metal film.

4. The semiconductor device according to claim 1, wherein the first insulating film contains nitrogen atom and silicon atom.

5. The semiconductor device according to claim 1, wherein the interlayer insulating film contains oxygen atom.

6. The semiconductor device according to claim 1, wherein the gate insulating film contains hafnium atom.

7. The semiconductor device according to claim 1, wherein the second insulating film contains aluminum oxide.

8. The semiconductor device according to claim 1, wherein the interlayer insulating film contains oxygen atom and silicon atom.

* * * * *